US008804784B2

(12) United States Patent
Kamatani

(10) Patent No.: US 8,804,784 B2
(45) Date of Patent: Aug. 12, 2014

(54) SEMICONDUCTOR LASER DRIVING DEVICE AND IMAGE FORMING APPARATUS HAVING THE SEMICONDUCTOR LASER DRIVING DEVICE

(75) Inventor: Tomohiko Kamatani, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 193 days.

(21) Appl. No.: 13/386,463

(22) PCT Filed: Jul. 14, 2010

(86) PCT No.: PCT/JP2010/062286
§ 371 (c)(1),
(2), (4) Date: Jan. 23, 2012

(87) PCT Pub. No.: WO2011/021469
PCT Pub. Date: Feb. 24, 2011

(65) Prior Publication Data
US 2012/0134378 A1    May 31, 2012

(30) Foreign Application Priority Data
Aug. 21, 2009    (JP) ................................. 2009-192353

(51) Int. Cl.
*H01S 3/00*    (2006.01)
(52) U.S. Cl.
USPC .................. 372/38.02; 372/38.01; 372/38.07; 372/38.09; 372/29.015
(58) Field of Classification Search
CPC .. H01S 5/0014; H01S 5/0021; H01S 5/06808
USPC ......... 372/38.01, 38.02, 38.07, 38.09, 29.015
See application file for complete search history.

(56) References Cited

U.S. PATENT DOCUMENTS

| 6,347,105 | B1* | 2/2002 | Nakayama et al. | 372/38.07 |
|---|---|---|---|---|
| 7,301,976 | B2* | 11/2007 | Ikeda et al. | 372/38.02 |
| 2004/0032890 | A1 | 2/2004 | Murata | |
| 2004/0188717 | A1* | 9/2004 | Ono | 257/200 |
| 2007/0053395 | A1 | 3/2007 | Kamatani et al. | |
| 2007/0171947 | A1* | 7/2007 | Bell | 372/38.08 |
| 2008/0013578 | A1* | 1/2008 | Moriya | 372/38.02 |
| 2008/0278098 | A1 | 11/2008 | Kamatani | |
| 2011/0228802 | A1 | 9/2011 | Furuse et al. | |

FOREIGN PATENT DOCUMENTS

| JP | 8-295048 | 11/1996 |
|---|---|---|
| JP | 9-289493 | 11/1997 |
| JP | 2000-280522 | 10/2000 |
| JP | 2004-22744 | 1/2004 |

(Continued)

OTHER PUBLICATIONS

International Search Report and Written Opinion in PCT/JP2010/062286.

*Primary Examiner* — Tod T Van Roy
(74) *Attorney, Agent, or Firm* — Cooper & Dunham LLP

(57) ABSTRACT

A semiconductor laser driving device that drives a semiconductor laser with a driving current output from a driving current output terminal is disclosed. The semiconductor laser driving device includes a driving current monitoring terminal configured to output a driving current monitoring current having a value of $1/\alpha$ of the driving current; a current-voltage conversion resistor connected to the driving current monitoring terminal and configured to convert the driving current monitoring current having the value of $1/\alpha$ of the driving current into a corresponding driving current monitoring voltage; and a detector configured to generate a reference voltage and detect whether the corresponding driving current monitoring voltage has reached the reference voltage.

9 Claims, 6 Drawing Sheets

(56) References Cited

FOREIGN PATENT DOCUMENTS

| | | |
|---|---|---|
| JP | 2005-32798 | 2/2005 |
| JP | 2007-73543 | 3/2007 |
| JP | 2007-210238 | 8/2007 |
| JP | 2010-123715 | 6/2010 |
| JP | 2011-198877 | 10/2011 |

* cited by examiner

SEMICONDUCTOR LASER DRIVING DEVICE AND IMAGE FORMING APPARATUS HAVING THE SEMICONDUCTOR LASER DRIVING DEVICE

RELATED APPLICATIONS

This application is a U.S. National Phase Application under 35 USC 371 of International Application PCT/JP2010/062286 filed Jul. 14, 2010.

This application claims the priority of Japan application No. 2009-192353 filed Aug. 21, 2009, the entire content of which is hereby incorporated by reference.

TECHNICAL FIELD

The invention generally relates to a semiconductor laser driving device and an image forming apparatus having the semiconductor laser driving device.

BACKGROUND ART

A semiconductor laser (i.e., laser diode, LD) generally has a relatively short lifespan in comparison to other semiconductor components, and an emission controller of the LD, or the like is generally configured to detect the degradation of LD with time, so that the degraded LD is replaced with a new one before it actually breaks down.

In an alternative technique for detecting the LD degradation, the LD is configured such that current flowing in the LD is constantly monitored over time to detect the LD degradation. For example, if the current flowing in the LD is monitored in each process of the semiconductor laser driving device assembly line, which one of the processes where the LD degradation has occurred may be instantly clarified. Accordingly, the LD degradation may be detected immediately and the degraded LD may be replaced with a new one at an earlier stage.

As one example of a related art technology for detecting LD degradation, Japanese Laid-Open Patent Application Publication No. 2000-280522 (also referred to as "Patent Document 1") discloses an image forming apparatus capable of detecting LD degradation by monitoring current-voltage converted voltages in which a laser diode LD and a resistor R are connected in series so as to monitor the current-voltage converted voltage. Likewise, as another example, Japanese Laid-Open Patent Application Publication No. 09-289493 (also referred to as "Patent Document 2") discloses an optical transmitter capable of detecting LD degradation by utilizing current flowing in elements of the optical transmitter. The disclosed optical transmitter includes a current mirror circuit configured to generate an LD current (current for causing the LD to emit a laser beam), and a resistor or transistor provided at an input side of the current mirror circuit for limiting surge current by utilizing the current flowing between the provided resistor or transistor and the elements of the current mirror circuit. Further, as still another example, Japanese Laid-Open Patent Application Publication No. 08-295048 (also referred to as "Patent Document 3") discloses an image forming apparatus capable of detecting LD degradation by providing an LD degradation detector. In the disclosed image forming apparatus, the LD degradation detector is provided with an LD connection terminal to detect the LD degradation.

However, as illustrated in the image forming apparatus disclosed in Patent Document 1, if the resistor R is serially connected to the LD, a resistance load and a parasitic capacitance component are generated in an output current line toward the LD, which may inhibit high-speed operation of the LD driving device. Similarly, in the optical transmitter disclosed in Patent Document 2, a resistance load and a parasitic capacitance component are generated in the input side of the current mirror circuit. Further, in the image forming apparatus disclosed in Patent Document 3, a resistance load may be generated in the LD output line.

Further, in disclosed Patent Documents 1 to 3, since a load is incorporated in a main circuit of the LD driving device, a value of the load may not easily be controlled. For example, if the load is incorporated as a semiconductor circuit in the main circuit, the accuracy in the current monitoring or surge current detection may be lowered due to variability in the resistors and elements. As a result, the emission controller or the like may need to perform electrically complicated fine adjustments in order to improve the detection accuracy, which may result in time-consuming work.

SUMMARY OF THE INVENTION

Accordingly, attempts have made to provide a novel and useful semiconductor laser driving device capable of monitoring current flowing in an LD emission main circuit (a main circuit for causing the LD to emit a laser beam) and detecting overcurrent without external complicated fine adjustments and with a minimum resistance load applied to the LD emission main circuit. Further, the invention provides an image forming apparatus including such a semiconductor laser driving device.

In one embodiment, there is provided a semiconductor laser driving device that drives a semiconductor laser with a driving current output from a driving current output terminal. The semiconductor laser driving device includes a driving current monitoring terminal configured to output a driving current monitoring current having a value of $1/\alpha$ of the driving current; a current-voltage conversion resistor connected to the driving current monitoring terminal and configured to convert the driving current monitoring current having the value of $1/\alpha$ of the driving current into a corresponding driving current monitoring voltage; and a detector configured to generate a reference voltage and detect whether the corresponding driving current monitoring voltage has reached the reference voltage.

In another embodiment, there is provided a semiconductor laser driving device driving a semiconductor laser with a driving current output from a driving current output terminal. The semiconductor laser driving device includes a driving current monitoring terminal configured to output a driving current monitoring current having a value of $1/\alpha$ of the driving current; a current-voltage conversion resistor connected to the driving current monitoring terminal and configured to convert the driving current monitoring current having the value of $1/\alpha$ of the driving current into a corresponding driving current monitoring voltage; a detector configured to generate a reference voltage and detect whether the corresponding driving current monitoring voltage has reached the reference voltage; and an alarm unit configured to externally report a detected result of the detector when the corresponding driving current monitoring voltage has reached the reference voltage.

In another embodiment, there is provided an image forming apparatus that includes one of the aforementioned semiconductor laser driving devices.

Other objects, features, and advantages of the present invention will become more apparent from the following detailed description when read in conjunction with the accompanying drawings.

BEST MODE FOR CARRYING OUT THE INVENTION

Preferred embodiments of the present invention are described below with reference to the accompanying drawings.

First Embodiment

Figure 1:
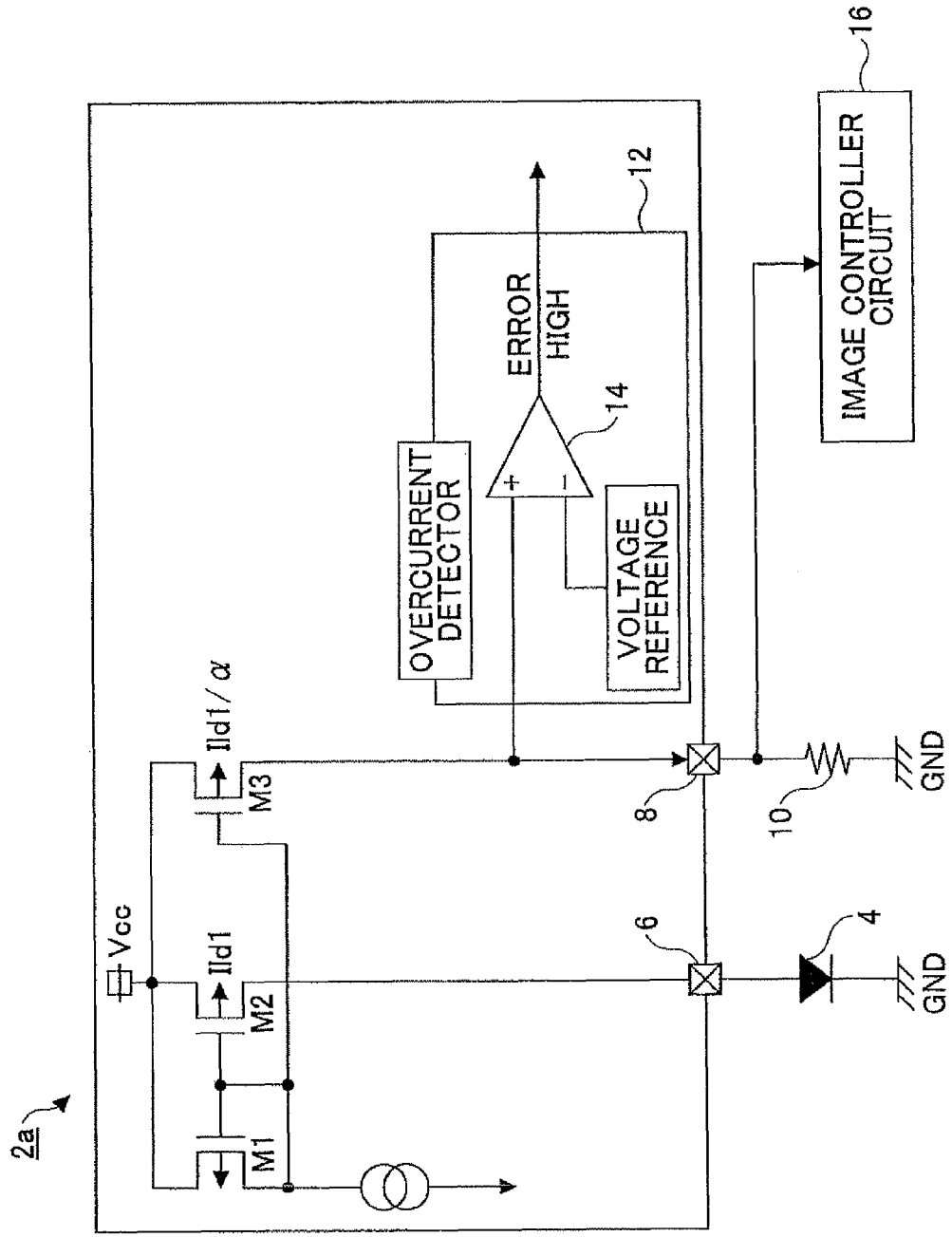
FIG. 1 is a schematic block diagram (a partial circuit diagram) illustrating a semiconductor laser driving device according to a first embodiment.

FIG. 1 is a schematic block diagram (a partial circuit diagram) illustrating a semiconductor laser driving device 2a according to a first embodiment.

As illustrated in FIG. 1, the semiconductor laser driving device 2a according to the first embodiment is configured to cause a first current mirror circuit composed of switching devices M1 and M2 to amplify a current. The amplified current is utilized as a driving current (i.e., laser diode (LD) driving current) and output to a load 4 (i.e., Laser Diode, hereinafter called an "LD 4") via a driving current terminal 6. Likewise, the semiconductor laser driving device 2a utilizes a current output from a second current mirror circuit composed of switching devices M1 and M3 as a driving current monitoring current (i.e., a laser diode (LD) driving current monitoring current). Note that a value of the LD driving current monitoring current is $1/\alpha$ of the driving current (see FIG. 1). Note also that the smaller a value of $\alpha$ is, the smaller the adverse effect of the LD 4 connected to the first current mirror circuit composed of switching devices M1 and M2 on the entire semiconductor laser driving device 2a will be, thereby reducing the rate of deterioration of the LD 4 caused by the LD driving current.

Further, in the semiconductor laser driving device 2a, a monitoring terminal 8 is configured to output the LD driving current monitoring current, and the monitoring terminal 8 is connected to a resistor 10, so that the LD driving current monitoring current output from the monitoring terminal 8 is converted into a voltage (LD driving current monitoring voltage) by the resistor 10. The image controller circuit 16 monitors the voltage of the monitoring terminal 8 to observe the change in the LD driving current over time. In this fashion, the rate of deterioration of the LD 4 may be instantly or intermittently detected.

Further, the monitoring terminal 8 is connected to a voltage comparator 14 that is utilized for the overcurrent detector 12. In the overcurrent detector 12, the voltage comparator 14 compares the converted monitor drive voltage with a reference voltage to output the compared result. That is, if the converted monitor drive voltage exceeds the reference voltage, the overcurrent detector 12 determines the result as the overcurrent, and outputs an "Error" (i.e., a "High" value in this case).

Accordingly, if an optimal value is set for the resistance of the external resistor 10 connected to the semiconductor laser driving device 2a, an overcurrent detection level may easily be set.

As illustrated in FIG. 1, in the semiconductor laser driving device 2a according to the first embodiment, the LD driving current monitoring current having a value $1/\alpha$ ($\alpha \geq 1$) of the LD driving current is supplied to the monitoring terminal 8 via a separate route from that of the LD driving current. Accordingly, the adverse effect of LD 4 on a main circuit of the LD driving current may be suppressed to a minimum. Further, the external resistor 10 is connected to the monitoring terminal to enable the resistor 10 to perform current-voltage conversion to provide a driving current monitoring voltage with excellent accuracy.

The semiconductor laser driving device 2a according to the first embodiment further includes an overcurrent detector 12 configured to detect the voltage of the monitoring terminal 8 exceeding a predetermined level so that the semiconductor laser driving device 2a may detect the overcurrent. Note that if the resistance of the resistor 10 is directly set, a range of the driving current monitoring voltage may be determined by the set resistance of the resistor 10. Accordingly, the overcurrent detection level may be set.

Second Embodiment

Figure 2:
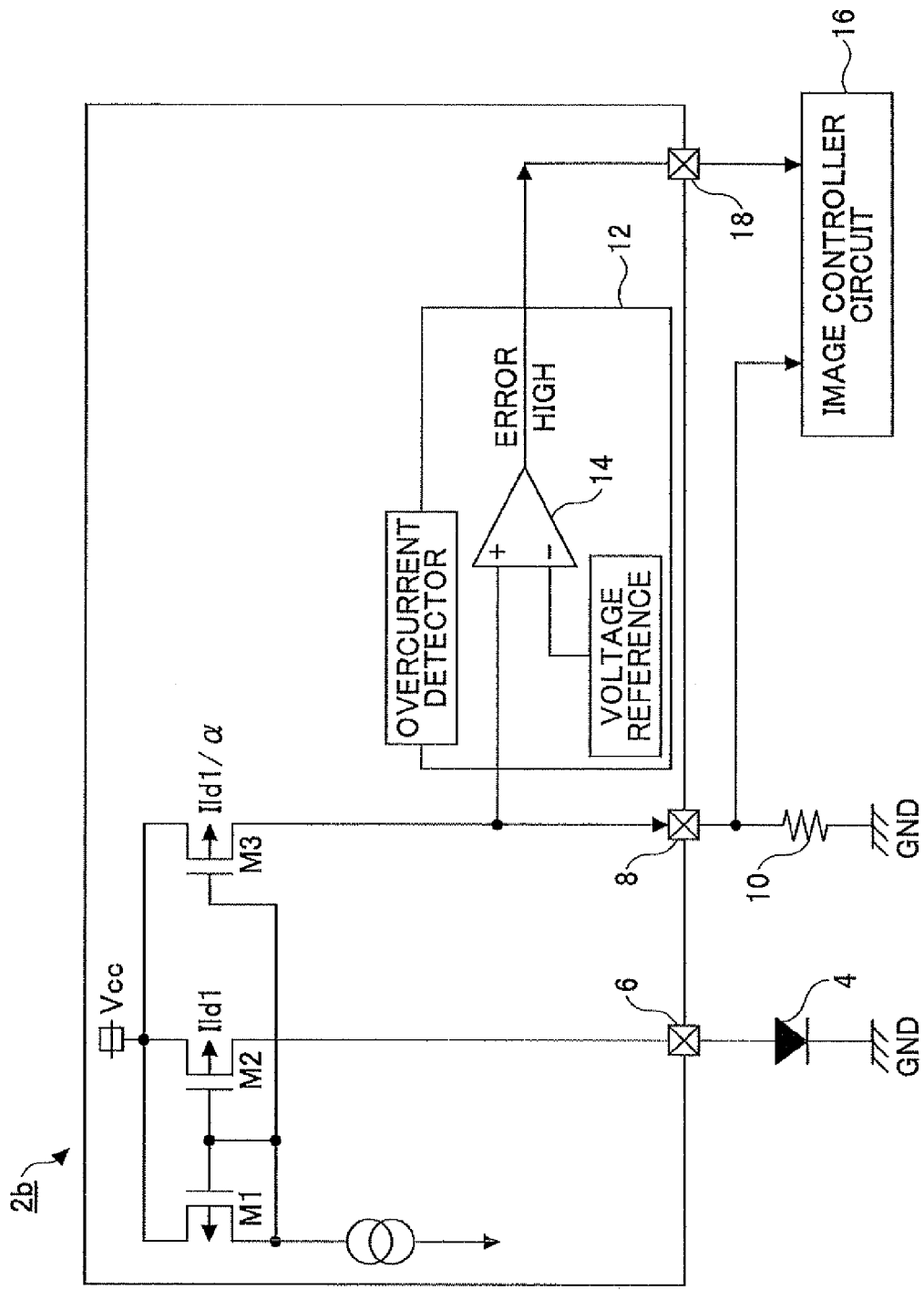
FIG. 2 is a schematic block diagram (a partial circuit diagram) illustrating a semiconductor laser driving device according to a second embodiment.

FIG. 2 is a schematic block diagram (a partial circuit diagram) illustrating a semiconductor laser driving device 2b according to a second embodiment. The semiconductor laser driving device 2b according to the second embodiment has approximately the same configuration as the semiconductor laser driving device 2a according to the first embodiment. Accordingly, the same reference numerals are assigned to the components identical to those of the first embodiment, and their descriptions are omitted. The description below is mainly focused on the difference between the first and second embodiments.

The semiconductor laser driving device 2b according to the second embodiment illustrated in FIG. 2 further includes an external alarm terminal 18 configured to externally report the detected result of the overcurrent detector 12 in addition to the components of the semiconductor laser driving device 2a according to the first embodiment (see FIG. 1).

On receiving the detected result of the overcurrent detector 12, the external alarm terminal 18 informs the image controller circuit 16 of the received detected result of the overcurrent detector 12. In this manner, the overcurrent detector 12 immediately detects the overcurrent or a larger than intended electric current flowing to drive the LD 4, and the image controller 16 can transmit some kind of instruction such as a load drive-control deactivation instruction for deactivating the driving of the load.

Third Embodiment

Figure 3:
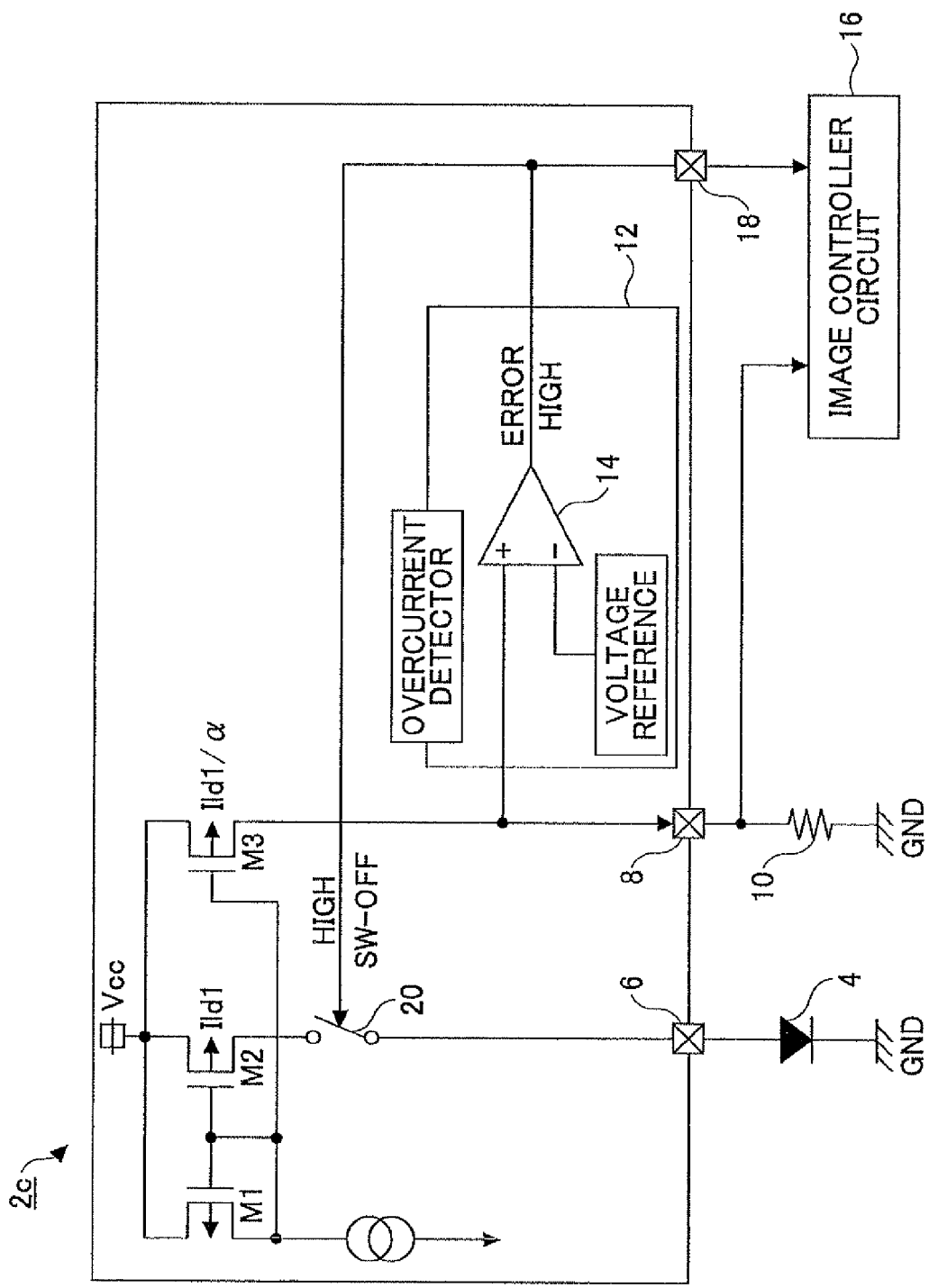
FIG. 3 is a schematic block diagram (a partial circuit diagram) illustrating a semiconductor laser driving device according to a third embodiment.

FIG. 3 is a schematic block diagram (a partial circuit diagram) illustrating a semiconductor laser driving device 2c according to a third embodiment. The semiconductor laser driving device 2c according to the third embodiment has approximately the same configuration as the semiconductor laser driving device 2b according to the second embodiment.

Accordingly, the same reference numerals are assigned to the components identical to those of the second embodiment, and their descriptions are omitted. The description below is mainly focused on the difference between the second and third embodiments.

The semiconductor laser driving device 2c according to the third embodiment illustrated in FIG. 3 further includes a deactivator 20 configured to deactivate the driving of the LD 4 when the overcurrent detector 12 detects the overcurrent in addition to the components of the semiconductor laser driving device 2b according to the second embodiment (see FIG. 2). As illustrated in FIG. 3, the deactivator 20 is switched off when the overcurrent detector 12 outputs the "high value".

In the semiconductor laser driving device 2b according to the second embodiment (see FIG. 2), when the external alarm terminal 18 receives the detected result from the overcurrent detector 12, the image controller 16 transmits the load drive-control deactivation instruction to deactivate the drive control of the LD 4. In the semiconductor laser driving device 2c according to the third embodiment, the deterioration of the LD 4 may be prevented when instantaneous overcurrent has flowed in the LD 4, in addition to the deactivation of the drive control of the LD 4.

That is, on detecting the voltage of the monitoring terminal 8 exceeding a predetermined level, the semiconductor laser driving device 2c according to the third embodiment immediately cuts off or reduces the LD driving current. Accordingly, the deterioration of the LD 4 may be prevented.

Fourth Embodiment

Figure 4:
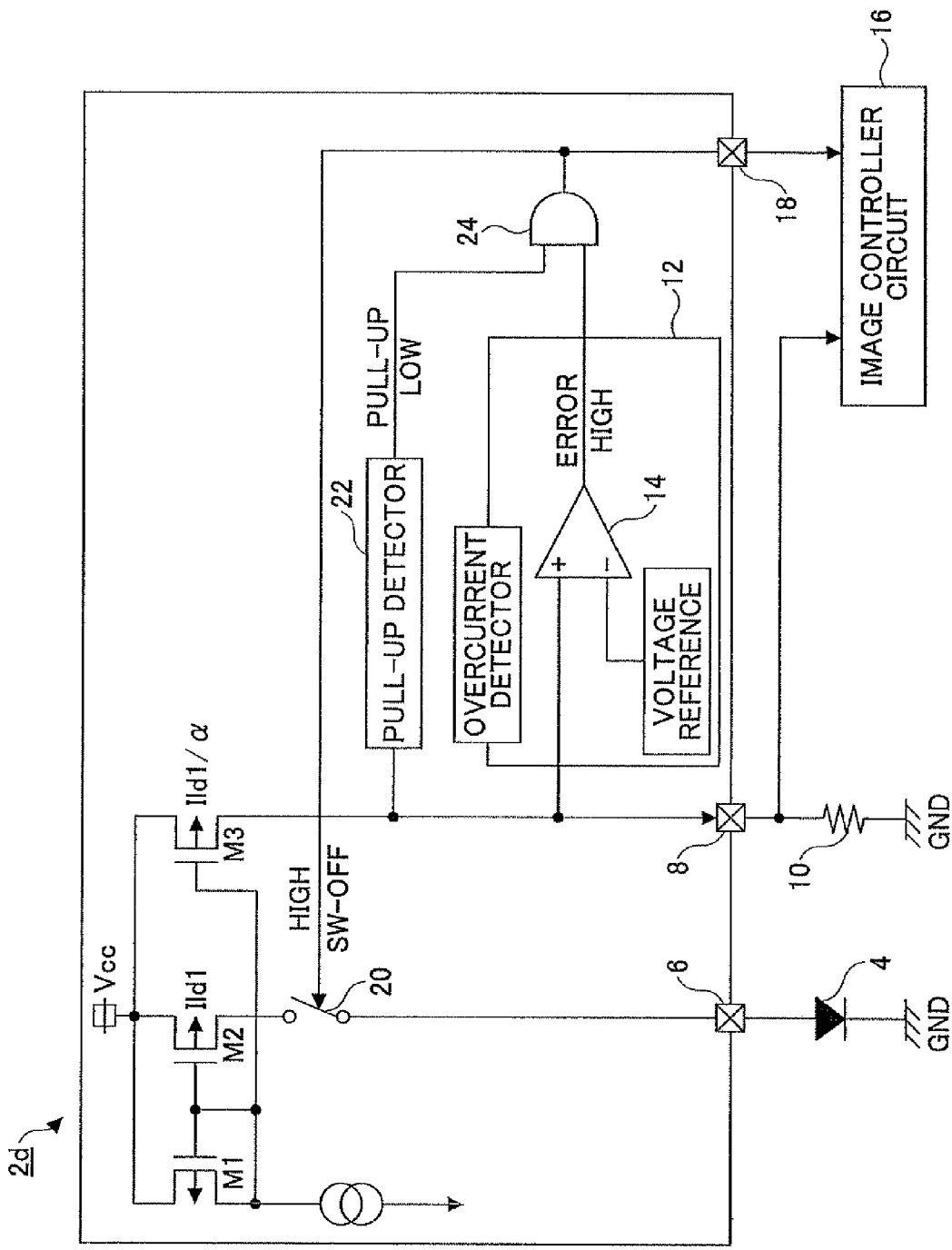
FIG. 4 is a schematic block diagram (a partial circuit diagram) illustrating a semiconductor laser driving device according to a fourth embodiment.

FIG. 4 is a schematic block diagram (a partial circuit diagram) illustrating a semiconductor laser driving device 2d according to a fourth embodiment. The semiconductor laser driving device 2d according to the fourth embodiment has approximately the same configuration as the semiconductor laser driving device 2c according to the third embodiment. Accordingly, the same reference numerals are assigned to the components identical to those of the third embodiment, and their descriptions are omitted. The description below is mainly focused on the difference between the third and fourth embodiments.

The semiconductor laser driving device 2d according to the fourth embodiment illustrated in FIG. 4 further includes a resistor disconnection detector circuit for the monitoring terminal 8 in addition to the components of the semiconductor laser driving device 2c according to the third embodiment (see FIG. 3). Note that the resistor disconnection detector circuit is a pull-up detector 22 (see FIG. 4). That is, when the monitoring terminal 8 is inactive (i.e., the monitoring terminal 8 is disconnected from the resistor 10), the pull-up detector 22 is in an "open state" or "pull-up state", and the pull-up detector 22 invalidates the detected result (e.g., overcurrent) of the overcurrent detector 12.

Note that as illustrated in FIG. 4, the pull-up detector 22 indicates "Low" when the monitoring terminal 8 is inactive (i.e., in the pull-up state) whereas the pull-up detector 22 indicates "High" when the monitoring terminal 8 is active (i.e., in a normal state). The semiconductor laser driving device 2d according to the fourth embodiment further includes an AND circuit 24 near the overcurrent detector 12, which is configured to report the overcurrent detection to the external alarm terminal 18, the image controller 16, and the deactivator 20 for deactivating the LD 4 simultaneously when the pull-up detector 22 and the overcurrent detector 12 both indicate "High".

In the semiconductor laser driving device 2d according to the fourth embodiment, the overcurrent detector 12 outputs a normal value when the monitoring terminal 8 is inactive. In this manner, malfunction of the semiconductor laser driving device 2d due to erroneous detection by the overcurrent detector 12 may be prevented.

Fifth Embodiment

Figure 5:
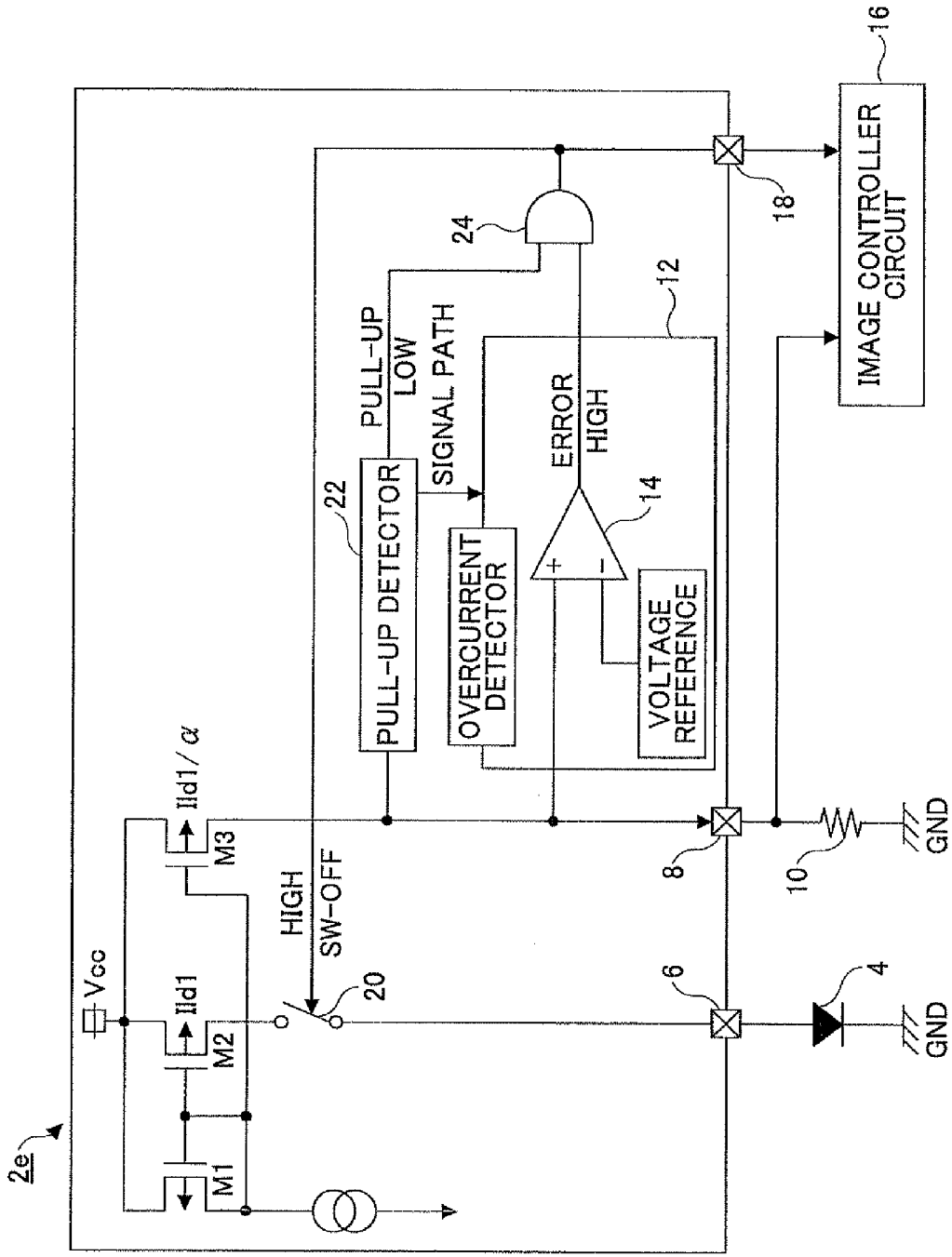
FIG. 5 is a schematic block diagram (a partial circuit diagram) illustrating a semiconductor laser driving device according to a fifth embodiment.

FIG. 5 is a schematic block diagram (a partial circuit diagram) illustrating a semiconductor laser driving device 2e according to a fifth embodiment. The semiconductor laser driving device 2e according to the fifth embodiment has approximately the same configuration as the semiconductor laser driving device 2d according to the fourth embodiment. Accordingly, the same reference numerals are assigned to the components identical to those of the fourth embodiment, and their descriptions are omitted. The description below is mainly focused on the difference between the fourth and fifth embodiments.

The semiconductor laser driving device 2e according to the fifth embodiment illustrated in FIG. 5 further includes a signal path, via which a signal indicating "whether the monitoring terminal 8 is disconnected from the resistor 10" output by the pull-up detector 22 is supplied to the overcurrent detector 12 in addition to the components of the semiconductor laser driving device 2d according to the fourth embodiment (see FIG. 4).

The overcurrent detector 12 is in a standby mode while receiving a signal indicating that the monitoring terminal 8 is disconnected from the resistor 10 (i.e., in a low-power consumption mode). In this manner, the power consumption in the entire semiconductor laser driving device 2e may be reduced.

That is, on detecting the disconnection of the monitoring terminal 8 from the resistor 10, the semiconductor laser driving device 2e according to the fifth embodiment immediately deactivates the overcurrent detector 12. Accordingly, the erroneous detection may be prevented by the deactivation of the overcurrent detector 12 while the monitoring terminal 8 is disconnected from the resistor 10, and the power consumption in the entire semiconductor laser driving device 2e may be reduced.

Sixth Embodiment

Figure 6:
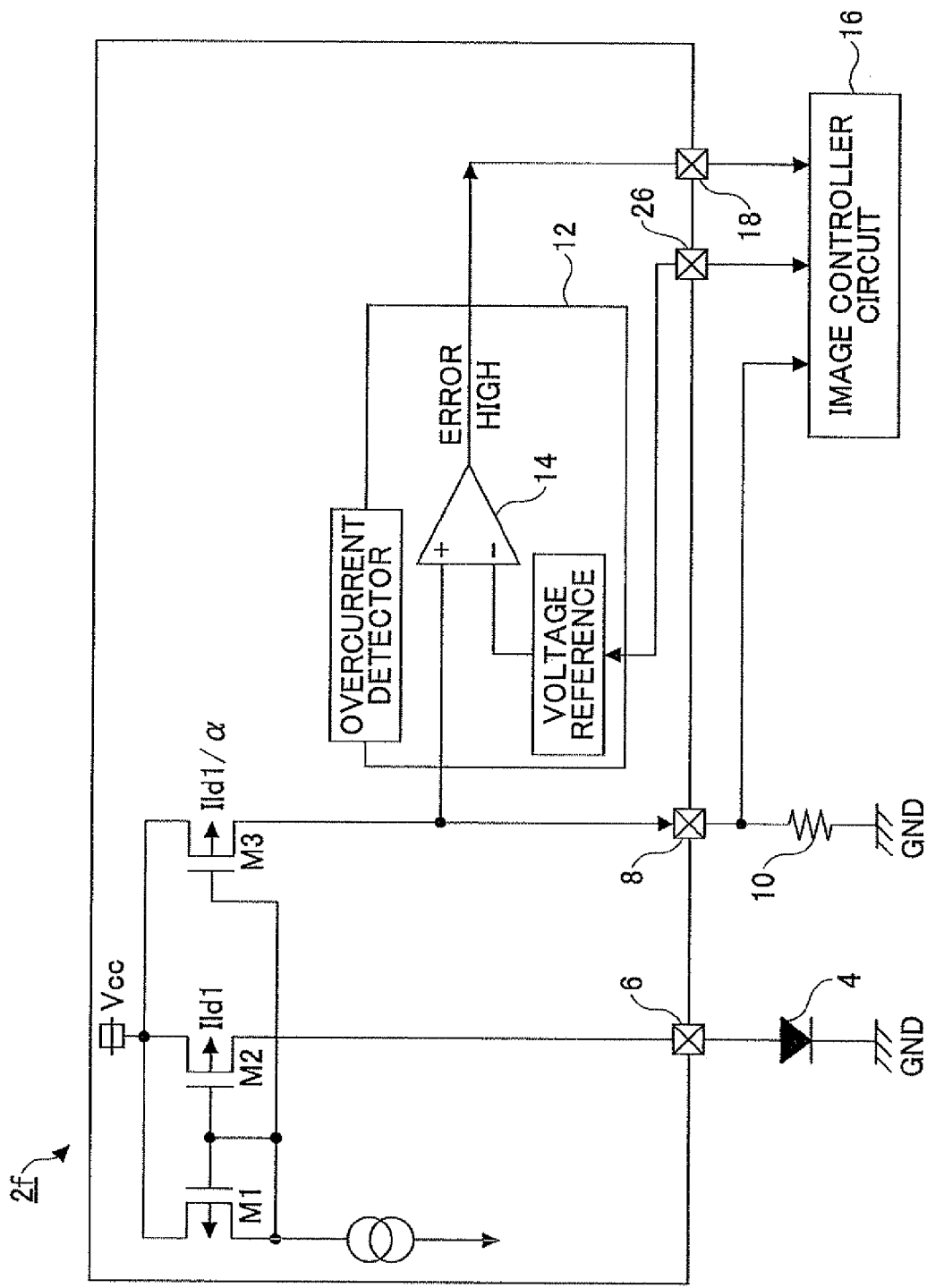
FIG. 6 is a schematic block diagram (a partial circuit diagram) illustrating a semiconductor laser driving device according to a sixth embodiment.

FIG. 6 is a schematic block diagram (a partial circuit diagram) illustrating a semiconductor laser driving device 2f according to a sixth embodiment. The semiconductor laser driving device 2f according to the sixth embodiment has approximately the same configuration as the semiconductor laser driving device 2b according to the second embodiment (see FIG. 2). Accordingly, the same reference numerals are assigned to the components identical to those of the second embodiment, and their descriptions are omitted. The description below is mainly focused on the difference between the second and sixth embodiments.

The semiconductor laser driving device 2f according to the sixth embodiment illustrated in FIG. 6 further includes a reference voltage setting terminal 26 in addition to the components of the semiconductor laser driving device 2b according to the second embodiment (see FIG. 2). In this configuration, the reference voltage of the overcurrent detector 12 is externally set via the reference voltage setting terminal 26. As illustrated in FIG. 6, the reference voltage of the overcurrent detector 12 may alternatively set by the image controller 16 via the reference voltage setting terminal 26.

In the semiconductor laser driving device 2f according to the sixth embodiment, the accuracy in the overcurrent detection may be improved by the external control of the reference voltage.

Other Embodiment

Any of the above-described semiconductor laser driving devices 2a through 2f according to first through sixth embodiments may each be incorporated in an image forming apparatus. The image forming apparatus having any one of such semiconductor laser driving devices 2a through 2f may be capable of monitoring a current and detecting the overcurrent without having a load in a main circuit of the semiconductor laser driving device and without external complicated fine adjustments.

The semiconductor laser driving devices according to the first through sixth embodiments are capable of monitoring current and detecting the overcurrent without having the load in the main circuit and without external complicated fine adjustments. Further, an image forming apparatus may be configured to have any of such semiconductor laser drive devices according to the first through sixth embodiments.

The present invention is not limited to the specifically disclosed embodiments, and variations and modifications may be made without departing from the scope of the present invention.

This patent application is based on Japanese Priority Patent Application No. 2009-192353 filed on Aug. 21, 2009, the entire contents of which are hereby incorporated herein by reference.

The invention claimed is:

1. A semiconductor laser driving device driving a semiconductor laser, the semiconductor laser driving device comprising:
   a driving current output terminal configured to output a driving current;
   a driving current monitoring terminal configured to output a driving current monitoring current having a value of $1/\alpha$, $\alpha \geq 1$, of the driving current, the driving current monitoring terminal being connected in parallel with a line of the driving current output terminal and a power supply voltage;
   a detector configured to detect whether the driving current monitoring terminal has reached a reference voltage, wherein
   the driving current monitoring terminal is connectable to a current-voltage conversion resistor outside the semiconductor laser driving device, and the current-voltage conversion resistor is configured to convert the driving current monitoring current having the value of $1/\alpha$ of the driving current into a corresponding driving current monitoring voltage; and
   a resistor disconnection detector configured to detect a disconnection of the current-voltage conversion resistor from the driving current monitoring terminal,
   wherein the detector for detecting whether the driving current monitoring terminal has reached the reference voltage is switched into a standby mode when the resistor disconnection detector detects the disconnection of the current-voltage conversion resistor from the driving current monitoring terminal and outputs a corresponding signal to the detector.

2. The semiconductor laser driving device of claim 1, further comprising:
   an alarm unit configured to externally report a detected result of the detector when the corresponding driving current monitoring voltage has reached the reference voltage.

3. The semiconductor laser driving device as claimed in claim 1, further comprising:
   a deactivator configured to immediately deactivate or suppress the driving of the semiconductor laser when the corresponding driving current monitoring voltage has reached the reference voltage.

4. The semiconductor laser driving device as claimed in claim 1, wherein the reference voltage of the detector is externally set.

5. An image forming apparatus comprising the semiconductor laser driving device as claimed in claim 1.

6. A semiconductor laser driving device driving a semiconductor laser, the semiconductor laser driving device comprising:
   a driving current output terminal configured to output a driving current;
   a driving current monitoring terminal configured to output a driving current monitoring current having a value of $1/\alpha$, $\alpha \geq 1$, of the driving current, the driving current monitoring terminal be in connected in parallel with a line of the driving current output terminal and a voltage;
   a detector configured to detect whether the driving current monitoring terminal has reached a reference voltage, wherein
   the driving current monitoring terminal is connectable to a current-voltage conversion resistor outside the semiconductor laser driving device and the current-voltage conversion resistor is configured to convert the driving current monitoring current having the value of $1/\alpha$ of the driving current into a corresponding driving current monitoring voltage;
   a resistor disconnection detector configured to detect a disconnection of the current-voltage conversion resistor from the driving current monitoring terminal; and
   an alarm unit configured to externally report a detected result of the detector when the corresponding driving current monitoring voltage has reached the reference voltage,
   wherein provided that the resistor disconnection detector has detected the disconnection of the current-voltage conversion resistor from the driving current monitoring terminal, the alarm unit does not externally report the detected result of the detector even if the corresponding driving current monitoring voltage has reached the reference voltage.

7. The semiconductor laser driving device as claimed in claim 6, wherein the reference voltage of the detector is externally set.

8. An image forming apparatus comprising the semiconductor laser driving device as claimed in claim 6.

9. The semiconductor laser driving device as claimed in claim 6, further comprising:
   a deactivator configured to immediately deactivate or suppress the driving of the semiconductor laser when the corresponding driving current monitoring voltage has reached the reference voltage.

* * * * *